(12) United States Patent
Zhao et al.

(10) Patent No.: US 11,287,477 B2
(45) Date of Patent: Mar. 29, 2022

(54) MAGNETIC PERFORMANCE MEASURING DEVICE FACING SERIALIZED CLAW POLE GENERATOR ROTOR

(71) Applicants: UNIV SHANGHAI JIAOTONG, Shanghai (CN); JIANGSU LONGCHENG PREC FORGING CO LTD, Changzhou (CN)

(72) Inventors: Zhen Zhao, Shanghai (CN); Chengliang Hu, Shanghai (CN); Minjun Tang, Changzhou (CN); Xiaofeng Tang, Changzhou (CN); Jinsheng Cheng, Changzhou (CN); Wei Sun, Changzhou (CN)

(73) Assignees: UNIV SHANGHAI JIAOTONG, Shanghai (CN); JIANGSU LONGCHENG PREC FORGING CO., LTD., Changzhou (CN)

( * ) Notice: Subject to any disclaimer, the term of this patent is extended or adjusted under 35 U.S.C. 154(b) by 120 days.

(21) Appl. No.: 16/645,869

(22) PCT Filed: Jul. 2, 2019

(86) PCT No.: PCT/CN2019/094314
§ 371 (c)(1),
(2) Date: Mar. 10, 2020

(87) PCT Pub. No.: WO2020/011059
PCT Pub. Date: Jan. 16, 2020

(65) Prior Publication Data
US 2020/0271724 A1    Aug. 27, 2020

(30) Foreign Application Priority Data

Jul. 13, 2018    (CN) .......................... 201810766938.2

(51) Int. Cl.
*G01N 27/72*     (2006.01)
*G01R 33/00*     (2006.01)
(Continued)

(52) U.S. Cl.
CPC ........... *G01R 31/346* (2013.01); *G01R 33/02* (2013.01)

(58) Field of Classification Search
CPC .......................... G01R 33/07; G01R 33/0017; G01R 33/0029; G01R 33/0035; G01R 33/02;
(Continued)

(56) References Cited

U.S. PATENT DOCUMENTS

2002/0117922 A1* 8/2002 Kim .................... H02K 7/12
                                                                310/114
2012/0056502 A1* 3/2012 Cai ..................... H02K 21/044
                                                                310/181
(Continued)

OTHER PUBLICATIONS

CN107037360 Machine Translation, Apr. 7, 2017 (Year: 2017).*
CN202309407 Machine Translation, Oct. 24, 2011 (Year: 2011).*

*Primary Examiner* — Raul J Rios Russo
(74) *Attorney, Agent, or Firm* — CBM Patent Consulting, LLC

(57) ABSTRACT

A magnetic performance measuring device for serialized claw-pole generator rotors is consisted with: an excitation power supply turn-on mechanism, a rotor magnetic field detecting mechanism, a measuring position adjusting mechanism and a pressing mechanism that are successively and fixedly arranged, wherein the rotor magnetic field detecting mechanism including a detection box, a positioning base, an adjusting ring, a shaft sleeve and a serialized grooved magnetic conduction ring that are successively arranged in the detection box, and the adjusting ring and the shaft sleeve are used to position different models of tested rotors to achieve a serialized measurement.

11 Claims, 8 Drawing Sheets

(51) Int. Cl.
*G01R 31/34* (2020.01)
*G01R 33/02* (2006.01)

(58) Field of Classification Search
CPC .. G01R 33/025; G01R 33/072; G01R 33/093; G01R 31/346
USPC ............... 324/51, 55, 200, 224, 225, 244
See application file for complete search history.

(56) References Cited

U.S. PATENT DOCUMENTS

| | | | |
|---|---|---|---|
| 2018/0145575 A1* | 5/2018 | Woehl-Bruhn | H02K 21/16 |
| 2018/0273016 A1* | 9/2018 | Xu | H02K 51/00 |
| 2020/0284858 A1* | 9/2020 | Tang | G01R 33/1253 |

* cited by examiner

MAGNETIC PERFORMANCE MEASURING DEVICE FACING SERIALIZED CLAW POLE GENERATOR ROTOR

TECHNICAL FIELD

This invention relates to a magnetic performance measurement technology, in particular to a magnetic performance measurement device for a series of claw-pole generator rotors.

BACKGROUND TECHNOLOGY

The current method of evaluating the rotor performance of claw-pole generators is to obtain the speed-current relationship curve by means of a device for testing the generation efficiency of generator. However, the test bench required by this method is complicated and expensive, and the whole assembly and disassembly process of the generator is required in the test. Besides, many uncontrollable factors are introduced during the manual installation process. The traditional measurement methods of magnetic properties require the production of standard samples (see "GB/T 13012-2008 Measurement methods for DC magnetic properties of soft magnetic materials"), so it is easy to ignore the uneven performance caused by the claw-pole manufacturing process, and the corresponding measurement results cannot fully reflect the overall magnetic properties of the rotor assembled from the claw-pole. The method of directly measuring the magnetic properties of the claw-pole generator rotor can avoid the shortcomings mentioned above. It is suitable for testing each part before motor assembly, and can be used to analyze the influence of rotor assembly and claw-pole manufacturing process on the magnetic properties of the rotor.

SUMMARY OF THE INVENTION

In view of the above shortcomings of the existing technology, a magnetic performance measurement device for serialized claw-pole generator rotors is proposed in this invention. Using the magnetizing winding of the claw-pole generator rotor itself, serial slotted guide ring and angle-adjustable index plate are designed to change the measuring position, and then the system error can be eliminated by one-time clamping and multi-position measurement.

The invention is realized by the following technical scheme:

The invention comprises an excitation power supply connection mechanism, a rotor magnetic field detection mechanism, a measurement position adjustment mechanism and a pressing mechanism which are sequentially and fixedly arranged;

And the rotor magnetic field detection mechanism comprises a detection box and a positioning base, an adjusting ring, a shaft sleeve and a serialized belt groove magnetic conduction ring which are sequentially arranged in the detection box, the adjusting ring is matched with the shaft sleeve hole shaft, the adjusting ring and the shaft sleeve are used for positioning different types of tested rotors, and serialized measurement is realized.

The connecting mechanism for excitation power supply includes the cylinder positioned on the guide pillar through height adjusting slider, and the power joint and lead wire connected with the control end of the cylinder. The two poles of power joint and lead wire are connected with the positive and negative poles of the excitation current output port in the DC magnetic performance measuring instrument of the detecting mechanism for rotor magnetic field.

The claw-pole generator rotor to be measured includes the rotor shaft, bearing sleeve, a pair of claw-poles, fan blades, bearing and magnetizing winding collector. The support base is provided with a through hole in center whose diameter is 1~2 times that of the rotor shaft, and it matches the adjusting ring with hole and shaft.

The serial slotted guide ring is provided with four centripetal slots for winding the measuring coils.

The measuring coils are connected in series with each other. When calculating the magnetic flux, the measured results of the planes corresponding to the four centripetal slots are averaged, which makes the rotor fault-tolerant in the actual measurement process. The winding method of the wire is as follows. Starting from any slot, firstly the wire is wound clockwise to the target coil turns number, then it is introduced to the adjacent slot and wound same number of turns in the counterclockwise direction, and then it is introduced to the adjacent next slot and wound same number of turns in the clockwise direction. At last, the fourth slot is wound counterclockwise the same number of turns. The positive and negative poles of the measuring coils are taken as the end of the wire which is introduced at the beginning and at last, respectively.

The maximum turns of the measuring coils can be calculated by formula $$n_{max} = \frac{\varphi_{max}}{4.8 \, h_{slot} \times t_{slot}},$$

where $\varphi_{max}$ is the maximum range of magnetic flux of DC magnetic performance measuring instrument.

The adjusting mechanism of measuring position includes a special shaped spline shaft and its support pedestal and an index plate with adjusting handle. The index plate is provided with limiting holes and it is connected with the limiting holes at the outer edge of the sleeve in the lower end through pins.

The pressing mechanism includes fixed base, triangular support, hydraulic cylinder, connecting rod structure and compacting ball head. The hydraulic cylinder pushes the connecting rod mechanism to make the compacting ball head contact with the upper end of the rotor shaft, and applies axial pressure to compact the rotor under test, so as to prevent vibration caused by impact magnetic field in the measurement process, and further reduce the measurement error.

Technical Effect

Compared with the existing method of evaluating the performance of claw-pole generator rotor by generator performance bench test, the invention provides a new technical approach. There is no need to disassemble and assemble generators repeatedly in the process of measurement and evaluation, and the measurement results can reflect the advantages and disadvantages of claw-pole generator rotor more sensitively and directly. The whole testing process is relatively simple, and the measurement cost can be greatly saved. From the magnetic properties measurement of material, compared with the current Chinese standard "GB/T 13012-2008 Measurement method of DC magnetic properties of soft magnetic materials", which stipulates the ring sample method and the permeameter measurement method, the invention can directly take the rotor of claw-pole generator as the tested object. The pressing mechanism is used to reduce the influence of rotor position fluctuation during the testing process. Then, the invention can avoid the influence of the processing history of standard sample on the test results, and it is faster and more convenient. In addition, each part can be tested non-destructively before the motor assembly, which can be used to analyze the influence of rotor assembly and manufacturing process of claw-pole on the magnetic properties of the rotor. In addition, the measuring position can be easily changed by adjusting the angle of the index plate, so the system error can be eliminated through multiple measurements of the same rotor. A series of different types of rotors can be measured by replacing the standardized pad and guide ring.

Figure 1:
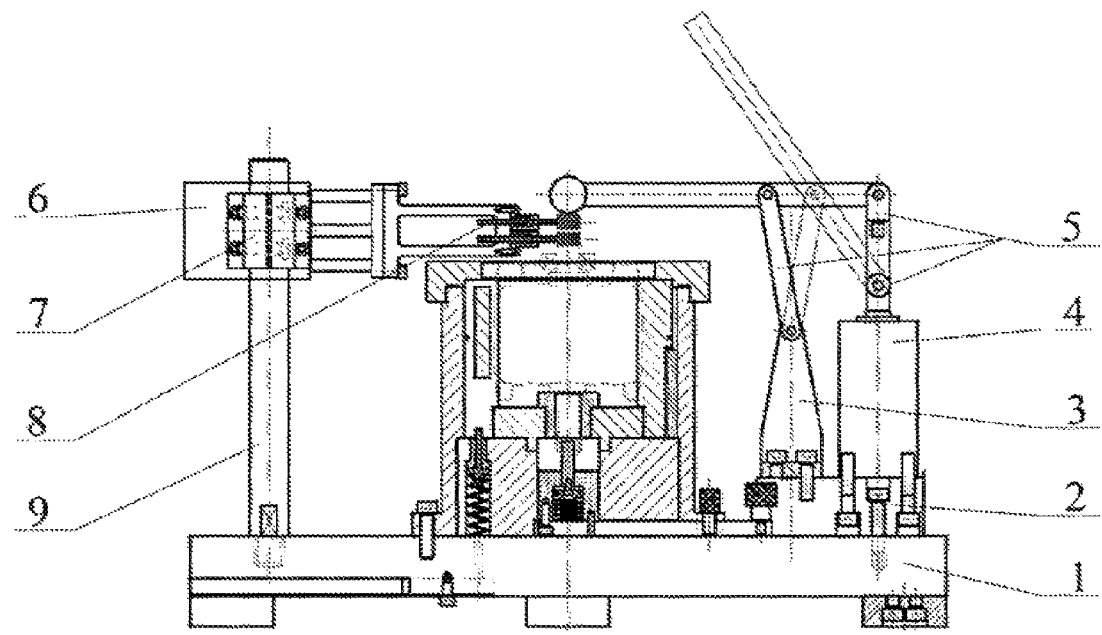
FIG. 1 shows a schematic diagram of the structure of the invention.

In the picture: baseplate 1, fixed base 2, triangular support 3, hydraulic cylinder 4, connecting rod structure 5, cylinder 6, height adjusting slider 7, power joint and lead wire 8, guide pillar 9, support base 10, centripetal slot 11, adjusting ring 12, serial slotted guide ring 13, cover plate 14, sleeve 15, claw-pole generator rotor to be tested 16, rotor shaft 16-1, bearing sleeve 16-2, a pair of claw-poles 16-3, fan blades 16-4, bearing 16-5, magnetizing winding collector 16-6, axle sleeve 17, special shaped spline shaft 18, support pedestal 19, index plate with adjusting handle 20.

Specific Implementation Method

FIG. 1 presents a magnetic performance measurement device for serialized claw-pole generator rotors described in this embodiment, which comprises a connecting mechanism for excitation power supply, a detecting mechanism for rotor magnetic field, an adjusting mechanism of measuring position and a pressing mechanism fixed in sequence.

As shown in FIG. 1, the connecting mechanism for excitation power supply includes the cylinder 6 positioned on the guide pillar 9 through height adjusting slider 7, and the power joint and lead wire 8 connected with the control end of the cylinder 6. The two poles of power joint and lead wire 8 are connected with the positive and negative poles of the excitation current output port in the DC magnetic performance measuring instrument of the detecting mechanism for rotor magnetic field. When the power joint works, it contacts the collector ring of the rotor under test. One end of the power joint is connected with the cylinder to adjust the contact state between the power joint and the collector ring and the height of the power joint through the flexibility of the cylinder, so as to match the different claw-pole generator rotors under test.

Figure 2:
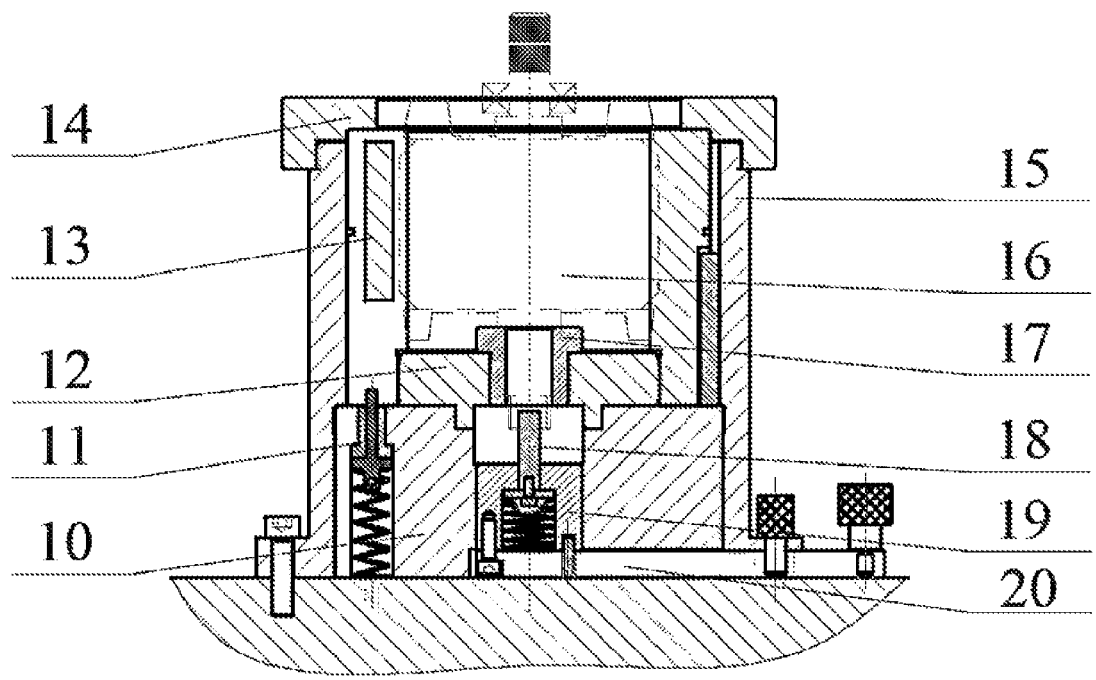
FIG. 2 shows a schematic diagram of the structure of adjustable positioning mechanism.

As shown in FIG. 2, the detecting mechanism for rotor magnetic field includes a detection box consisting of cover plate 14, baseplate 1 and sleeve 15, and the support base 10, adjusting ring 12, axle sleeve 17 and serial slotted guide ring 13 arranged in the detection box in turn. The support base 10 is fixed at the lower end of the sleeve 15, and the adjusting ring 12 is embedded in the support base 10. Different types of rotors 16 to be tested are positioned using the adjusting ring 12 and the axle sleeve 17 to realize the serial measurement.

The sleeve 15 is designed with two limiting holes at outer edge in the lower end, and the angle between adjacent limiting holes is 30°.

The sleeve 15 is fixedly connected with the baseplate 1 by screw. The cover plate 14 is placed on the upper end of the sleeve 15 with thread connection to compact the slotted guide ring 13, so as to prevent vibration caused by the impact magnetic field.

Both the sleeve 15 and support base 10 in the lower end are designed with a fan-shaped groove of 40° to facilitate the rotation of the adjusting mechanism of measuring position. Both are made of paramagnetic materials.

Figure 3:
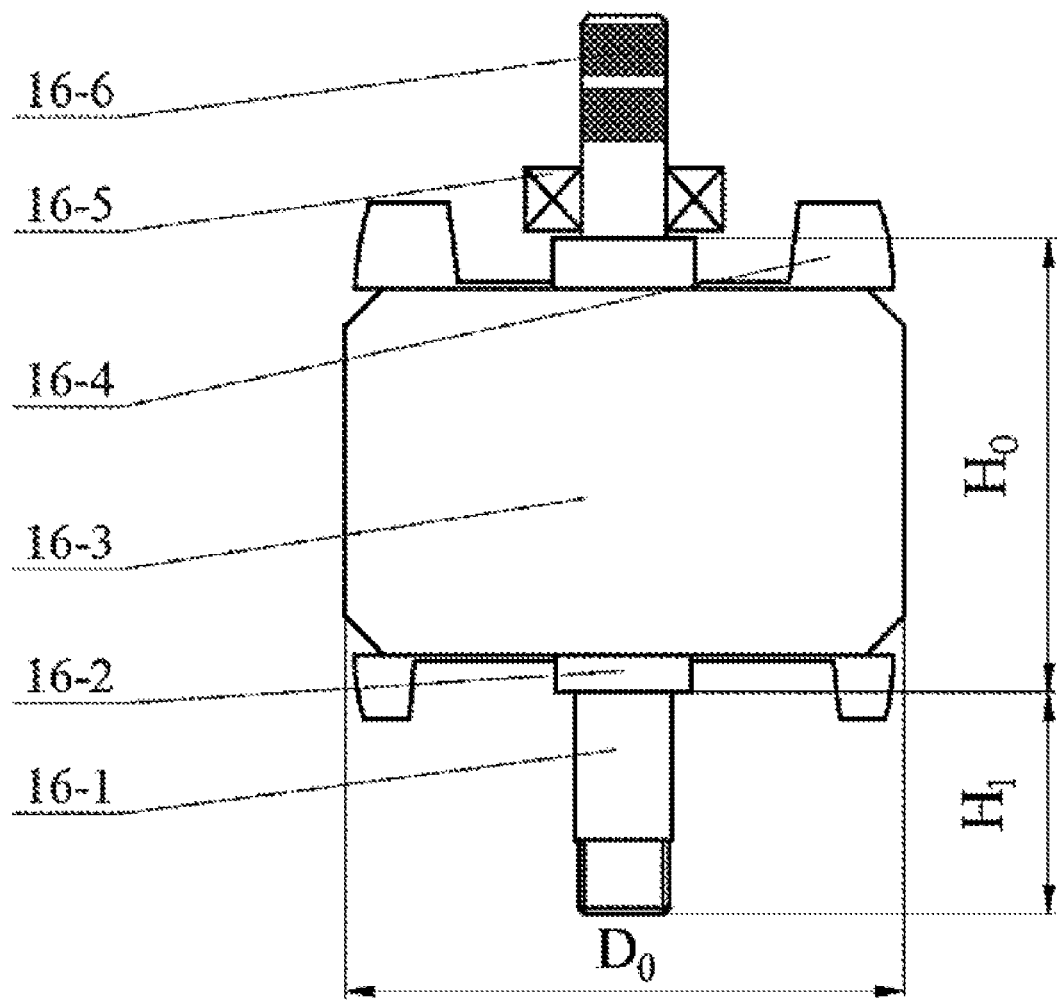
FIG. 3 shows the schematic diagram of the rotor to be tested in the claw-pole generator.

As shown in FIG. 3, the claw-pole generator rotor 16 to be measured includes the rotor shaft 16-1, bearing sleeve 16-2, a pair of claw-poles 16-3, fan blades 16-4, bearing 16-5 and magnetizing winding collector 16-6.

Figure 4:
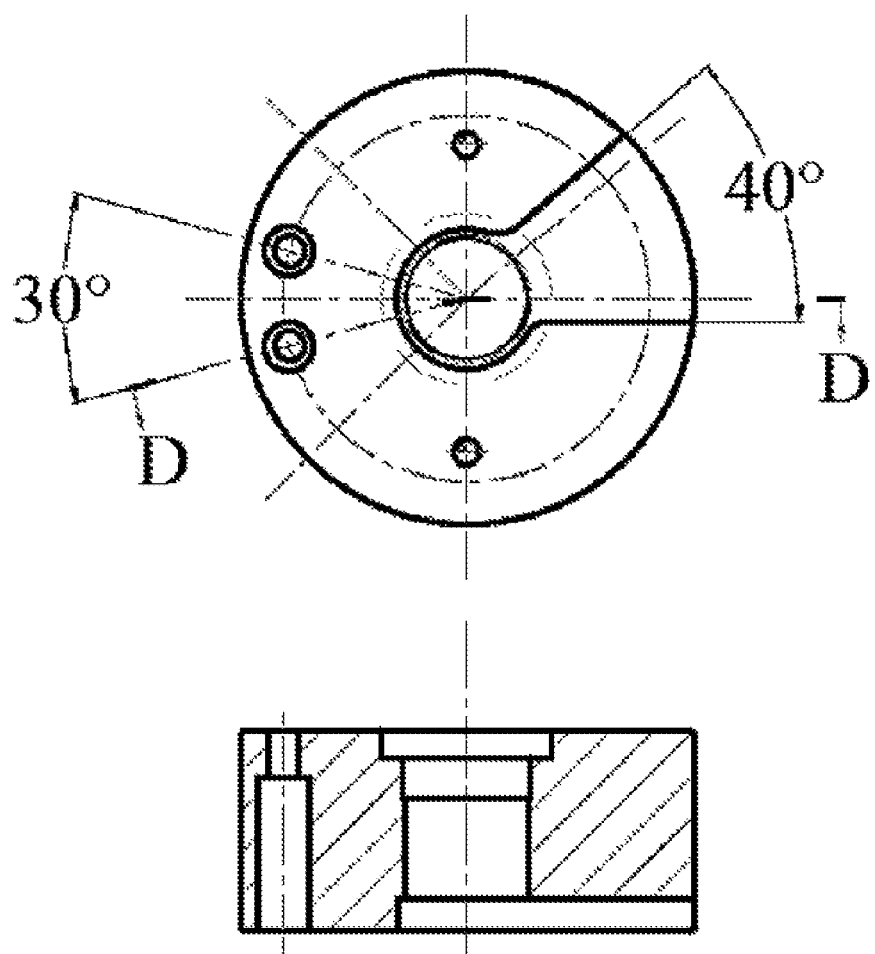
FIG. 4 shows the schematic diagram of the support base.

As shown in FIG. 4, the support base 10 is provided with a through hole in center whose diameter is 2~3 times that of the rotor shaft 16-1, and it matches the adjusting ring 12 with hole and shaft.

Figure 5:
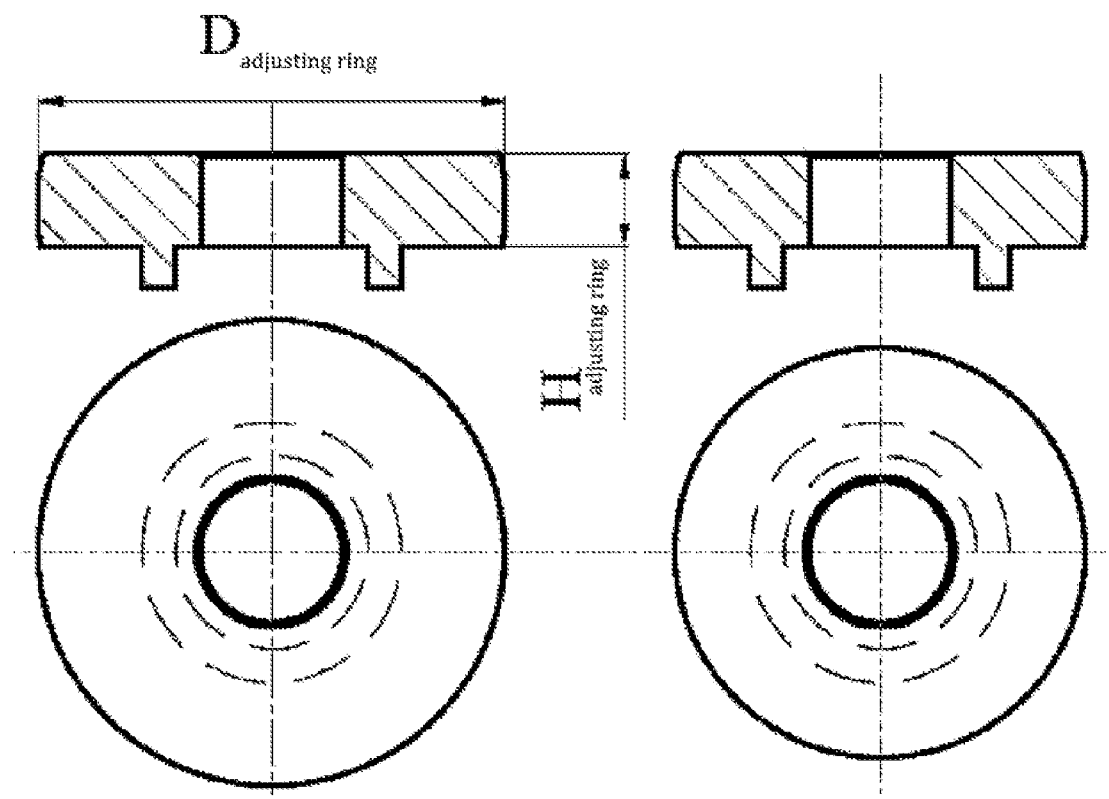
FIG. 5 shows the schematic diagram of adjusting ring.

As shown in FIG. 5, the outer diameter of the adjusting ring 12 is $D_{adjusting\ ring}=(1.05\sim1.1)D_0$, where $D_0$ is the outer diameter of the specific claw-pole generator rotor 16 to be measured. The height of adjusting ring 12 is $H_{adjusting\ ring}=0.5H_{1\text{-}min}$, where $H_{1\text{-}min}$ is the minimum of the lower end lengths $H_1$ of the rotor shafts 16-1 in a series of claw-pole generators to be measured. The adjusting ring 12 is connected with the axle sleeve 17 with hole and shaft. The adjusting ring 12 in lower end is connected with the support base 10 with hole and shaft through a ring structure, and the inner diameter of the ring structure is the same as that of the central through-hole of the support base 10. The adjusting ring 12 is made of paramagnetic material.

Figure 6:
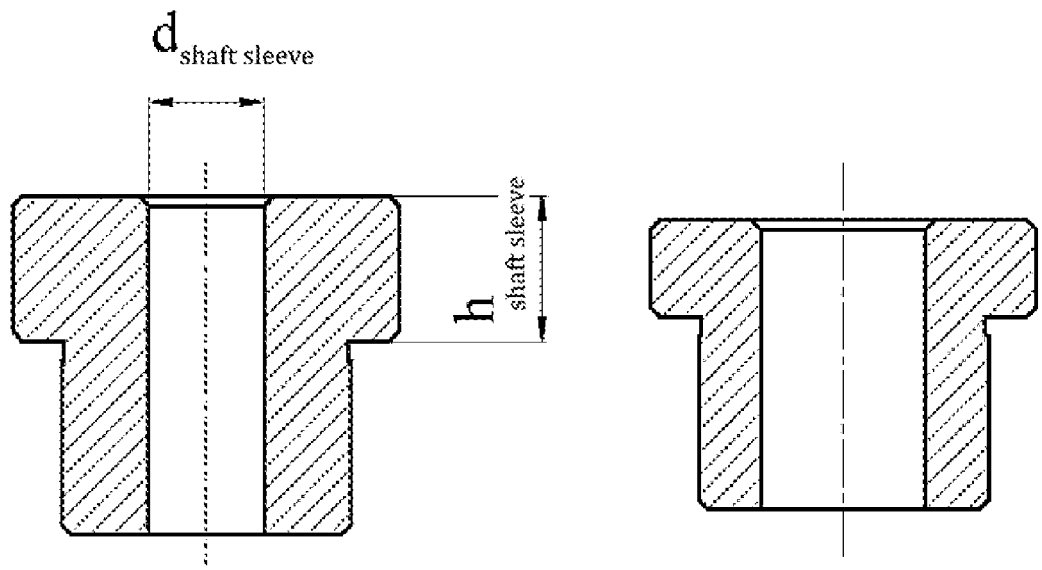
FIG. 6 shows the schematic diagram of axle sleeve.

As shown in FIG. 6, the inner diameter $d_{axle\ sleeve}$ of the axle sleeve 17 is the same as the diameter of the rotor shaft 16-1, including the large end and the small end of the ladder. The outer diameter of the large end is twice that of the bearing sleeve 16-2 in the claw-pole generator rotor, and the diameter of the small end is the same as that of the through hole of the adjusting ring 12. The height of the large end is $h_{axle\ sleeve}=\eta(H_1-H_{adjusting\ ring})$, where coefficient $\eta$ is 0.8~0.9, and the height of the small end is the same as that of the adjusting ring 12. The axle sleeve 17 is made of paramagnetic material.

Figure 7:
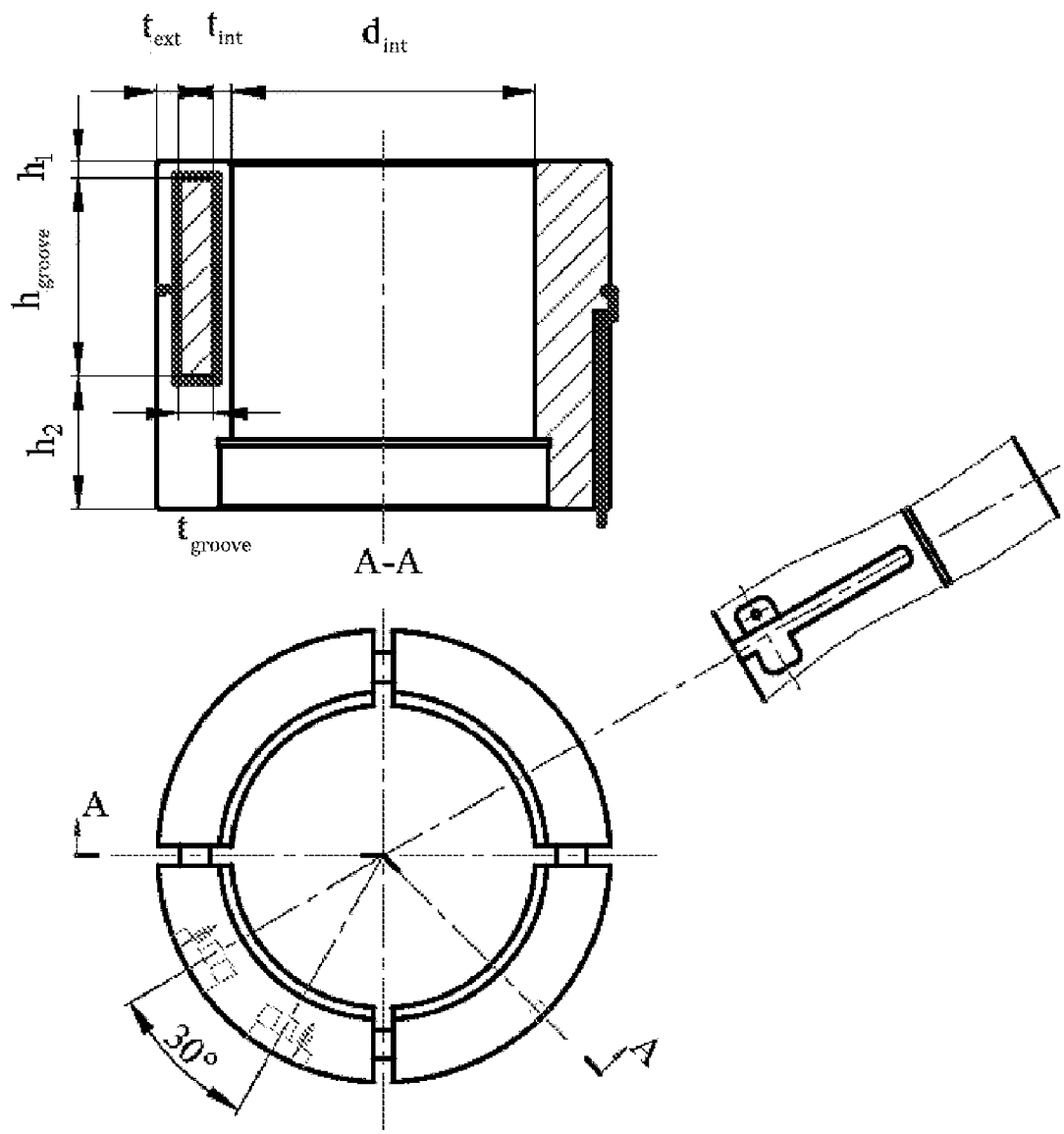
FIG. 7 shows the schematic diagram of serial slotted guide ring.

As shown in FIG. 7, in order to ensure that the slotted guide ring 13 can effectively cover the measured claw-pole generator rotor 16 during testing, the height of the serial slotted guide ring 13 is $H_{guide\ ring}=h_1+h_{slot}+h_2$, where $h_{slot}=0.8H_0$, $H_0$ is the distance between the upper and lower end faces of the claw-pole generator rotor 16 to be measured, $h_1$ is not less than $0.1H_0$, $h_2=H_{adjusting\ ring}+h_{axle\ sleeve}+0.1H_0$.

The slotted guide ring 13 is provided with four centripetal slots 11 for winding the measuring coils, and the angles between the four centripetal slots 11 are $2\alpha$, 90°, $2\beta$ and 90° respectively, and $\alpha$ and $\beta$ satisfy $|\alpha-\beta|=(1\sim2°)$, $\alpha+\beta=90°$. The width of the four slots is $$t_{slot} = \kappa \frac{S_{claw\ pole}}{h_{slot}},$$

where κ=0.165~0.185, $S_{claw\ pole}$ is the boss cross-section area of the claw-pole of the tested rotor. The circumferential width of the slots is 5~6 mm. The internal radial depth $t_{internal}$ of the slots is 4~5 mm, and the external radial depth $t_{external}$ is not less than 5 mm. The unilateral gap between the inner diameter of the slotted guide ring 13 and the outer diameter of the measured rotor is 0.2~0.4 mm, and the outer diameter of slotted guide ring 13 is $D_{guide\ ring} = d_{inner} + 2t_{slot} + 2t_{external} + 2t_{internal}$. The material is soft magnetic material with high permeability and saturated magnetic induction intensity.

The measuring coils are connected in series with each other. When calculating the magnetic flux, the measured results of the four planes are averaged, which makes the rotor fault-tolerant in the actual measurement process. The winding method of the wire is as follows. Starting from any slot, firstly the wire is wound clockwise to the target coil turns number, then it is introduced to the adjacent slot and wound same number of turns in the counterclockwise direction, and then it is introduced to the adjacent next slot and wound same number of turns in the clockwise direction. At last, the fourth slot is wound counterclockwise the same number of turns. The positive and negative poles of the measuring coils are taken as the end of the wire which is introduced at the beginning and at last, respectively.

The maximum turns of the measuring coils can be calculated by formula $$n_{max} = \frac{\varphi_{max}}{4.8\,h_{slot} \times t_{slot}},$$

where $\varphi_{max}$ is the maximum range of magnetic flux of DC magnetic performance measuring instrument.

In order to adapt to the serialized claw-pole generator rotors 16, the total height $H_{guide\ ring}$ and outer diameter $D_{guide\ ring}$ of the serial slotted guide ring 13 are fixed values. The total height $H_{guide\ ring}$ of the slotted guide ring 13 is the maximum value of height of the slotted guide rings corresponding to all types of claw-pole generator rotors to be measured, and the outer diameter $D_{guide\ ring}$ is also the maximum of outer diameter of the slotted guide rings corresponding to all types of rotors. The outer diameter $D_0$ of claw-pole generator rotor 16, the rotor height $H_0$ and the lower end length $H_1$ of the rotor shaft, the key geometric parameters of slotted guide ring 13, adjusting ring 12 and axle sleeve 17 matched with the rotor can be calculated.

The type parameters of serialized claw-pole generator rotor 16 (unit: mm):

| Rotor number | $H_0$ | $H_1$ | $D_0$ | $d_{rotor\ shaft}$ |
|---|---|---|---|---|
| Type 1 | 79.8 | 39.25 | 91.8 | 17 |
| Type 2 | 79.8 | 39.25 | 93.8 | 17 |
| Type 3 | 79.8 | 39.25 | 98.8 | 18 |
| Type 4 | 74 | 36 | 98.8 | 17 |
| Type 5 | 74 | 36 | 98.8 | 18 |

The geometric parameters of adjusting ring 12 (unit: mm):

| | Adapted adjusting ring | |
|---|---|---|
| Rotor number | $D_{adjusting\ ring}$ | $H_{adjusting\ ring}$ |
| Type 1 | 96.4 | 18 |
| Type 2 | 98.5 | 18 |
| Type 3 | 104 | 18 |
| Type 4 | | |
| Type 5 | | |

The geometric parameters of axle sleeve 17 (unit: mm):

| | Adapted axle sleeve | |
|---|---|---|
| Rotor number | $d_{axle\ sleeve}$ | $h_{axle\ sleeve}$ |
| Type 1 | 17 | 17 |
| Type 2 | | |
| Type 3 | 18 | 17 |
| Type 4 | 17 | 15.3 |
| Type 5 | 18 | 15.3 |

The geometric parameters of the slotted guide ring 13 (unit: mm):

| Rotor number | Adapted slotted guide ring | | | | | | | | |
|---|---|---|---|---|---|---|---|---|---|
| | $h_{slot}$ | $h_1$ | $h_2$ | $t_{slot}$ | $t_{internal}$ | $t_{external}$ | $d_{inner}$ | $D_{guide\ ring}$ | $H_{guide\ ring}$ |
| Type 1 | 63.8 | >=8 | 43 | 6 | 5 | >=5 | 92.4 | 132.4 | 114.8 |
| Type 2 | 63.8 | >=8 | 43 | 6 | 5 | >=5 | 94.4 | | |
| Type 3 | 63.8 | >=8 | 43 | 6 | 5 | >=5 | 99.4 | | |
| Type 4 | 59.2 | >=7.4 | 40.7 | 6.5 | 5 | >=5 | 99.4 | | |
| Type 5 | 59.2 | >=7.4 | 40.7 | 6.5 | 5 | >=5 | 99.4 | | |

Figure 8:
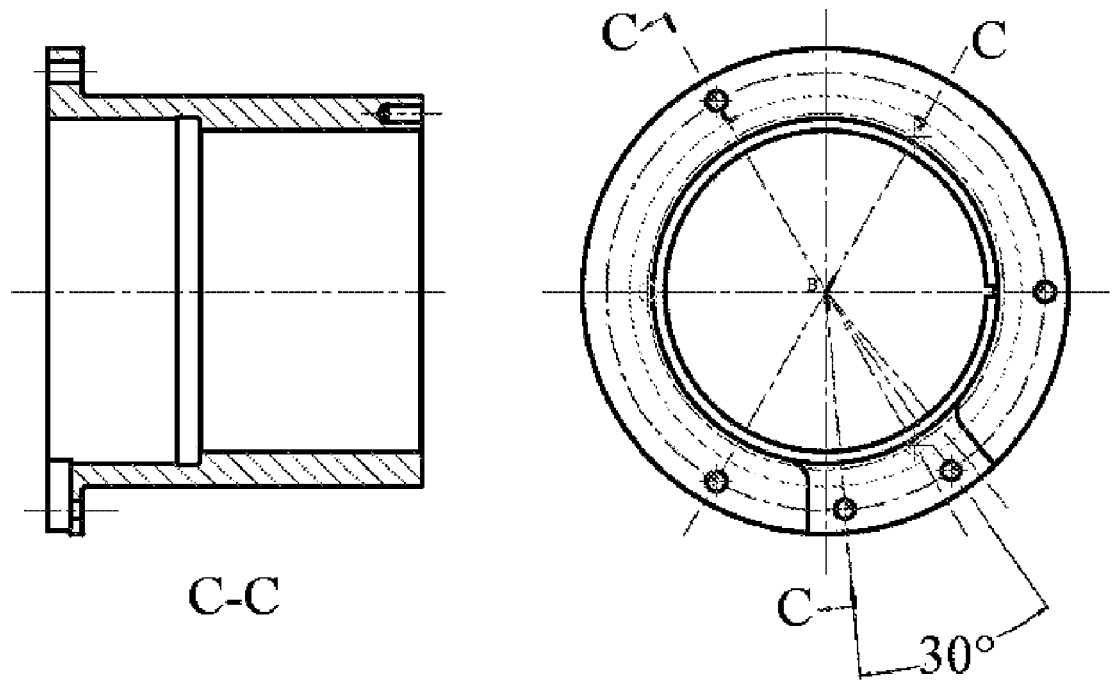
FIG. 8 shows the schematic diagram of sleeve.

As shown in FIG. 8, the upper end of the sleeve 15 is in clearance fit with slotted guide ring 13 through hole and shaft, and the lower end is in clearance fit with support base 10 through hole and shaft. The thickness of the sleeve 15 is generally 10~15 mm. The sleeve 15 is designed with a fan-shaped groove of 40° in the lower end to facilitate the rotation of the adjusting mechanism of measuring position. It is made of paramagnetic material.

The cover plate 14 is connected with the upper end of sleeve 15 through internal thread, and it compacts the slotted guide ring 13. The cover plate 14 is made of paramagnetic material.

Figure 9:
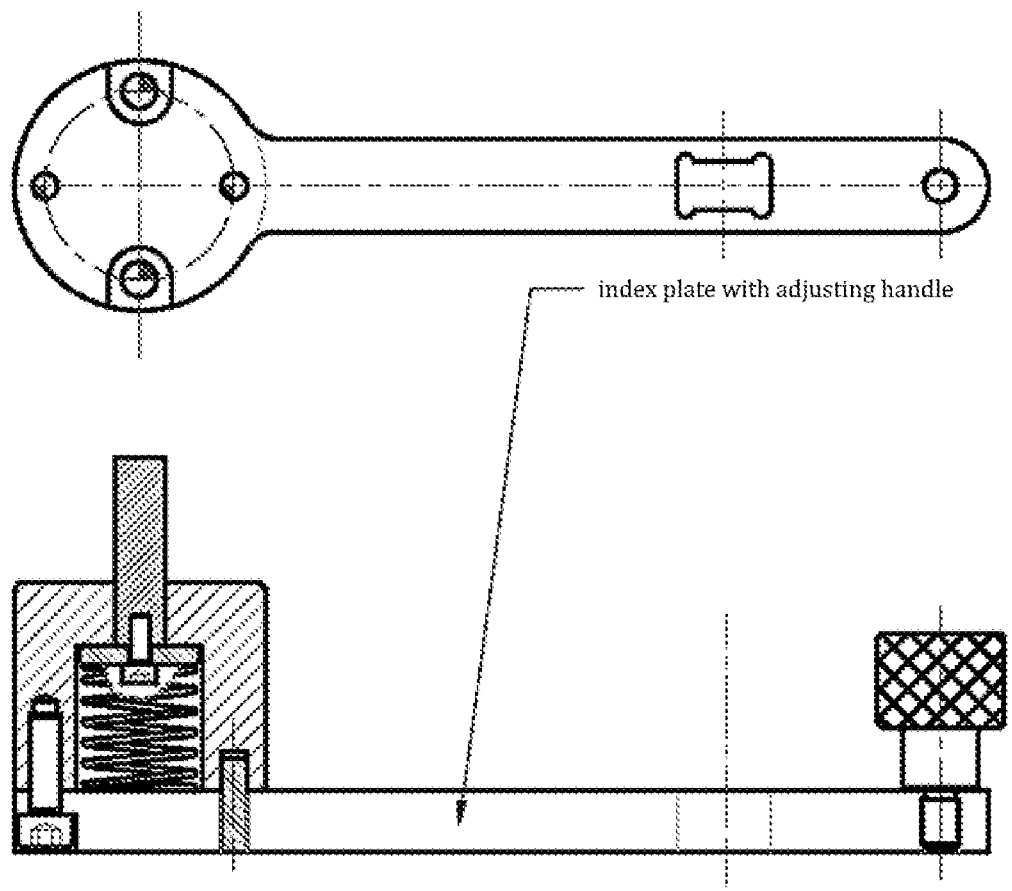
FIG. 9 shows the schematic diagram of the structure of adjusting mechanism of measuring position and index plate.

As shown in FIG. 9, the adjusting mechanism of measuring position comprises the special shaped spline shaft 18 and its support pedestal 19 and index plate with adjusting handle 20. The index plate 20 is provided with limiting holes and they are connected with the limiting holes at the outer edge of sleeve 15 in the lower end through pins. When working, the adjusting handle 20 is rotated to the limiting hole position of sleeve 15, driving the support pedestal 19 fixed with it. Then, the special-shaped keyway on the support pedestal 19 drives the special shaped spline shaft 18, and the special shaped spline shaft 18 drives the rotor to be measured 16 rotate to the target measuring position.

The pressing mechanism includes fixed base 2, triangular support 3, hydraulic cylinder 4, connecting rod structure 5 and compacting ball head. The hydraulic cylinder 4 pushes the connecting rod mechanism 5 to make the compacting ball head contact with the upper end of the rotor shaft of the rotor 16, and applies axial pressure to compact the rotor under test, so as to prevent vibration caused by impact magnetic field in the measurement process, and further reduce the measurement error.

The baseplate 1 is used for fixing the support base, sleeve, pressing mechanism and connecting mechanism for excitation power supply.

The test steps of the device are as follows:

Before starting the test, it is necessary to input the turns number of magnetizing winding N1 of claw-pole generator rotor itself, the turns number of measuring coils and the cross-sectional area of the slot $h_{slot} \times t_{slot}$ of the slotted guide ring in the DC magnetic performance measuring instrument. The turns number of measuring coils is the sum of the coils wound on the slots of the slotted guide ring.

Step 1: the claw-pole generator rotor 16 to be tested is prepared and checked, confirming whether the rotor shaft is tightened manually, and whether the magnetizing winding and lead-out wire are broken with universal power meter.

Step 2: The rotor type of the claw-pole generator to be measured, the slotted guide ring 13, the adjusting ring 12 and the axle sleeve 17 are selected. After the installation of the measuring device, the claw-pole generator rotor 16 to be measured is put into the measuring device, confirming the positioning reliable.

Step 3: the power joint and lead wire of the connecting mechanism for excitation power supply are connected with the positive and negative poles of the excitation current output port N1 in the DC magnetic performance measuring instrument. The two poles of the measuring coils are respectively connected with the positive and negative poles of the measuring current input port N2 in the DC magnetic performance measuring instrument.

Step 4: The excitation current range of 0~3.75 A and the acquisition frequency of the measurement results are set. The corresponding relationship curve between the excitation current and the average magnetic induction intensity can be obtained after starting the measurement.

Step 5: The test results are recorded.

Step 6: The adjusting handle of the index plate is rotated to make the limiting hole of the index plate is aligned with the second positioning hole on the sleeve and they are connected with pins. Then, the fourth and fifth steps are repeated.

Step 7: The results of repeated measurements are averaged to obtain the overall magnetization curve of the claw-pole generator rotor. The horizontal coordinate is the excitation current value, and the longitudinal coordinate is the average magnetic induction intensity.

Figure 10:
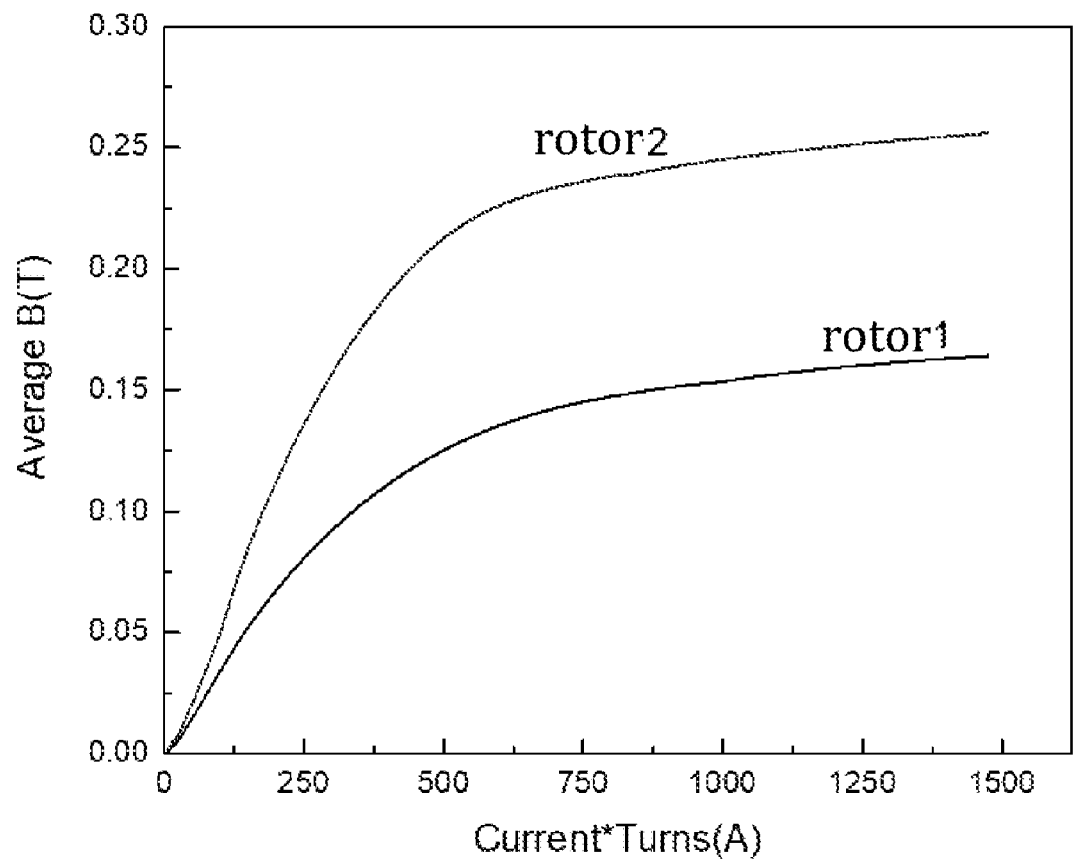
FIG. 10 shows the overall magnetization curves of all the tested claw-pole generator rotors.

Step 8: The rotor or rotor type of claw-pole generator that needs to be measured is replaced, and the first to seventh steps are repeated, and then the overall magnetization curves of all the tested claw-pole generator rotors can be obtained, as shown in FIG. 10.

The specific implementation of the above-mentioned proposal can be partially adjusted by the technical personnel in this field in different ways without departing from the principles and purposes of the invention. The protection scope of the invention is subject to the claim and is not limited by the above-mentioned specific implementation, and the implementation schemes within the scope of the invention are constrained by the invention.

What is claimed is:

1. A magnetic performance measurement device for serialized claw-pole generator rotors comprising an excitation power supply connection mechanism, a rotor magnetic field detection mechanism, a measurement position adjustment mechanism and a pressing mechanism which are sequentially and fixedly arranged;

and the rotor magnetic field detection mechanism comprises a detection box and a positioning base, an adjusting ring, a shaft sleeve and a serialized belt groove magnetic conduction ring which are sequentially arranged in the detection box, the adjusting ring is matched with the shaft sleeve, the adjusting ring and the shaft sleeve are used for positioning different types of tested rotors, and serialized measurement is realized;

wherein the excitation power supply connecting mechanism includes a cylinder positioned on a guide pillar through a height adjusting slider, a power joint and a lead wire connected with a control end of the cylinder, in which two poles of the power joint and the lead wire are connected with positive and negative poles of an excitation current output port in a DC magnetic performance measuring instrument of the rotor magnetic field detecting mechanism.

2. The magnetic performance measurement device described in claim 1, in which the detection box consists of a cover plate, a baseplate and a sleeve, and the sleeve is fixedly connected with the baseplate by a screw, and the cover plate is placed on the upper end of the sleeve with thread connection to compact a slotted guide ring which prevents vibration caused by a impact magnetic field.

3. The magnetic performance measurement device described in claim 1, in which a claw-pole generator rotor to be measured includes a rotor shaft, a bearing sleeve, a pair of claw-poles, fan blades, bearing and magnetizing winding collector, and a support base is provided with a through hole in center whose diameter is 1~2 times that of the rotor shaft which matches the adjusting ring with a hole and a shaft.

4. The magnetic performance measurement device described in claim 3, in which an outer diameter of the adjusting ring is $D_{adjusting\ ring}=(1.05~1.1) D_0$, where $D_0$ is an outer diameter of a specific claw-pole generator rotor to be measured, and a height of the adjusting ring is $H_{adjusting\ ring}=0.5H_{1-min}$, where $H_{1-min}$ is minimum of lower end lengths $H_1$ of the rotor shaft in a series of claw-pole generators to be measured, and the adjusting ring is connected with an axle sleeve with a hole and a shaft, and the adjusting ring in lower end is connected with the support base with a hole and a shaft through a ring structure, and an inner diameter of the ring structure is the same as that of a central through-hole of the support base.

5. The magnetic performance measurement device described in claim 4, in which the inner diameter $d_{axle\ sleeve}$ of the axle sleeve is the same as the diameter of the rotor shaft, including a large end and a small end of a ladder, and an outer diameter of the large end of the ladder is twice that of the bearing sleeve in the claw-pole generator rotor, and a diameter of the small end of the ladder is the same as that of the through hole of the adjusting ring, and a height of the large end of the ladder is $h_{axle\ sleeve}=\eta(H_1-H_{adjusting\ ring})$, where η is a coefficient, and a height of the small end of the ladder is the same as that of the adjusting ring, and the axle sleeve is made of a paramagnetic material.

6. The magnetic performance measurement device described in claim 3, in which a height of a serial slotted guide ring is $H_{guide\ ring}=h_1+h_{slot}+h_2$, where $h_{slot}=0.8H_0$, $H_0$ is the distance between a upper and a lower end faces of the claw-pole generator rotor to be measured, $h_1$ is not less than $0.1H_0$, $h_2=H_{adjusting\ ring}+h_{axle\ sleeve}+0.1H_0$;

and the serial slotted guide ring is provided with four centripetal slots for winding measuring coils, and the angles between the four centripetal slots are 2α, 90°, 2β and 90° respectively, and α and β satisfy $|α-β|=(1~2)°$, $α+β=90°$, and a width of the four centripetal slots is $$t_{slot} = \kappa \frac{S_{claw\ pole}}{h_{slot}},$$

where κ=0.165~0.185, $S_{claw\ pole}$ is a boss cross-section area of a claw-pole of a tested rotor, and a circumferential width of the four centripetal slots is 5~6 mm, and an internal radial depth $t_{internal}$ of the four centripetal slots is 4~5 mm, and an external radial depth $t_{external}$ is not less than 5 mm, and an unilateral gap between an inner diameter of the slotted guide ring and an outer diameter of a measured rotor is 0.2~0.4 mm, and an outer diameter of the slotted guide ring is $D_{guide\ ring}=d_{inner}+2t_{slot}+2t_{external}+2t_{internal}$.

7. The magnetic performance measurement device described in claim 6, in which the said measuring coils are connected in series with each other, and the winding method of the wire is as following:

starting from any slot, firstly the wire is wound clockwise to target numbers of turns, then it is introduced to an adjacent slot and wound same number of turns in the counterclockwise direction, and then it is introduced to next of the adjacent slot and wound same number of turns in the clockwise direction, at last, a fourth slot is wound counterclockwise the same number of turns, and the positive and negative poles of the measuring coils are taken as the end of the wire which is introduced at the beginning and at last, respectively;

and the maximum turns of the measuring coils can be calculated by formula $$n_{max} = \frac{\varphi_{max}}{4.8\,h_{slot} \times t_{slot}},$$

where $\varphi_{max}$ is a maximum range of magnetic flux of the DC magnetic performance measuring instrument, and measured results of the planes corresponding to the four centripetal slots are averaged, making the rotor fault-tolerant in an actual measurement process.

8. The magnetic performance measurement device described in claim 2, in which total height $H_{guide\ ring}$ and outer diameter $D_{guide\ ring}$ of the serial slotted guide ring are fixed values, and the total height $H_{guide\ ring}$ of the slotted guide ring is the maximum value of height of the slotted guide rings corresponding to all types of a claw-pole generator rotors to be measured, and the outer diameter $D_{guide\ ring}$ is also a maximum of outer diameter of the serial slotted guide ring corresponding to all types of rotors, and an outer diameter $D_0$ of the claw-pole generator rotor, a rotor height $H_0$ and a lower end length $H_1$ of a rotor shaft, key geometric parameters of the serial slotted guide ring, the adjusting ring and an axle sleeve matched with the rotor can be calculated.

9. The magnetic performance measurement device described in claim 1, in which an upper end of a sleeve is in clearance fit with a slotted guide ring through a hole and a shaft, and a lower end of the sleeve is in clearance fit with a support base through a hole and a shaft, and the sleeve is designed with a fan-shaped groove in the lower end for rotation of the measuring position adjusting mechanism.

10. The magnetic performance measurement device described in claim 1, in which the measuring position adjusting mechanism comprises a special shaped spline shaft whose support pedestal and index plate with an adjusting handle, and the index plate is provided with limiting holes.

11. The magnetic performance measurement device described in claim 1, in which the pressing mechanism includes a fixed base, a triangular support, a hydraulic cylinder, a connecting rod structure and a compacting ball head, and the hydraulic cylinder pushes the connecting rod structure to make the compacting ball head contact with an upper end of a rotor shaft, and applies axial pressure to compact the rotor shaft under testy which prevents vibration caused by impact magnetic field in a measurement process, and further reduce a measurement error.

* * * * *